United States Patent
Wable

(10) Patent No.: US 10,171,764 B2
(45) Date of Patent: Jan. 1, 2019

(54) APPARATUS, SYSTEM AND METHOD FOR A MANUFACTURED IMAGER SYSTEM

(71) Applicant: Girish S. Wable, St. Petersburg, FL (US)

(72) Inventor: Girish S. Wable, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 80 days.

(21) Appl. No.: 14/838,136

(22) Filed: Aug. 27, 2015

(65) Prior Publication Data

US 2017/0064229 A1   Mar. 2, 2017

(51) Int. Cl.
*H04N 5/369* (2011.01)
*H01L 27/146* (2006.01)
*H01L 21/66* (2006.01)
*H04N 5/225* (2006.01)

(52) U.S. Cl.
CPC .............. *H04N 5/369* (2013.01); *H01L 22/20* (2013.01); *H01L 27/14618* (2013.01); *H01L 27/14625* (2013.01); *H01L 27/14685* (2013.01); *H04N 5/2257* (2013.01)

(58) Field of Classification Search
CPC .............. H04N 5/369; H01L 27/14625; H01L 27/14685; H01L 27/14618
USPC ............................................................ 438/7
See application file for complete search history.

(56) References Cited

U.S. PATENT DOCUMENTS

2012/0145779 A1* 6/2012 Bietenbeck ...... G06K 19/06037
235/375

* cited by examiner

*Primary Examiner* — Anthony Ho
(74) *Attorney, Agent, or Firm* — Thomas J. McWilliams; Barnes & Thornburg LLP

(57) ABSTRACT

An apparatus, system and method are disclosed for a manufactured imager system. The apparatus, system and method may include an imager comprising a plurality of photosites divisible into a plurality of subsections, and at least one wafer-level lens additively composed of a plurality of material layers successively deposited directly upon the imager to achieve a predetermined optical performance for each of the plurality of subsections. The material layers may comprise one or more of a photopolymer, a thermoplastic resin, a low temperature melting glass, and a glass sheet, and may be uniform or non-uniform.

7 Claims, 6 Drawing Sheets

APPARATUS, SYSTEM AND METHOD FOR A MANUFACTURED IMAGER SYSTEM

BACKGROUND OF THE DISCLOSURE

Field of the Disclosure

The present disclosure is directed to imager systems, and, more specifically, to an apparatus, system and method for a manufactured imager system.

Description of the Background

Electronic imager systems are used, for example, in photo-imaging applications. An imager may be formed from charge-coupled-devices (CCD) or complementary metal oxide semiconductor (CMOS) devices. An imager may contain many thousands of transistors which, in essence, define pseudo-"pixels" arranged in an array.

By way of example, mobile device cameras, such as smartphone cameras, typically are based upon a small photosensor integrated circuit imager (e.g., an OmniVision OVT14825 CMOS image sensor) that integrates with the hardware and software of the mobile device. The image sensors are typically configured with a "screen" formed of pseudo-"pixels" in the form of photosites, and at least one port for communicating with, for example, other device elements connected via a substrate, such as one found on a processor, on which the image sensor (also referred to herein as an "imager") resides. The imager may generally includes millions of such light-sensitive photosites. The photosites each optically receive some portion of that which is in the view field of at least one lens placed "atop" the photosites to form an imager system, and hence the lens is communicatively associated with the imager in the imager system to produce the recorded images.

Imagers may be provided as various structures. For example, separate imager dies may be formed, such as part of chip scale packaging (CSP) or as part of through-silicon via (TSV) modules. Regardless of the particular construction of the imager, however, the aforementioned lens is generally useful to focus an image upon the "pixels" of the imager. The lens may generally be separately manufactured through well-known processes, such as casting, injection molding, machining, or the like, and is thereafter positioned at a precise focal distance from the surface of the imager die in order to produce an acceptably sharp image. In the case of imagers used in devices such as mobile phones, the lens of such an imager system may be set to a fixed, optical focal position.

By way of further example, conventional fabrication techniques for mobile device imager systems may use a lens barrel or a fixed stand-off to achieve a desired focal length, or an attachment of the lens using active alignment, such as aided by an adhesive and/or using in situ monitoring of the optical image quality. Thus, in the case of imager systems used in devices such as mobile phones, the lens may typically be set to a fixed optically optimal focal position, which may not provide the desired optical images or resolution, or aligned using complex manufacturing steps, each of which may encounter relatively high costs, manufacturing complexity and low yield.

Additionally, optical tolerances for imager systems have generally become smaller, increasing the level of precision required for positioning the lens relative to the imager. In many devices, the lens, lens array and/or lens system may typically be separately and discretely manufactured and installed directly on the imager in a separate assembly process, which means a method of optically corresponding the lens to the imager is required. Accordingly, conventional fabrication techniques use the aforementioned active alignment or mechanical adjustment techniques to obtain the desired or acceptable image quality from the imager system.

More specifically, traditional imager systems, such as camera modules, are typically assembled passively, i.e., without utilizing information from the camera module components. Active alignment techniques allowed for determination of the optimal relative positioning of camera module components based on the functional output of one or more of the camera module components being assembled. For example, since positional feedback of the camera module components could thus be based on, for example, the output of the imager during manufacturing assembly, rather than solely with reference to the physical geometries of the components being assembled, the individual component tolerances and overall imager tolerance became less critical in the manufacturing process.

However, conventional lens barrels, lens standoffs or actively aligned lenses can increase cost, and may not be easily adjusted to achieve desired image quality. Further, the foregoing techniques may require a high degree of complicated and expensive automation. Moreover, these techniques do not allow for compensation for a wide range of tolerance issues within the lens, imager or any additional cover glass associated with the imager system. This may be, in part, for example, due to the adjustment to achieve the correct focal length being made separately and/or uses the afore-discussed complex automation, and/or in part because the use of additional materials, such as adhesives, and additional process steps, such as in the case of active alignment, involve discrete manufacturing of parts and devices, shipments of parts or devices, and/or discrete positioning, verification and monitoring of these other parts, devices and techniques, which, of course, all have individual tolerances. Yet further, in the aforementioned cases there is often an interfering interface layer or layers, such as air, that may increase the diffraction of light or that may implicate the use of other complex injection molding processes, and which thus further contribute to unintended variations in and from tolerances.

The importance of the issues above is evident notwithstanding that, once an image is captured by an assembled imager system, the communicative connection to the device's processing system allows for processing of the image received at the imager. This is because such processing may typically be suitable only for improving an image of acceptable quality at capture, and hence is not well adapted to "fix" a poor image that suffers from, for example, poor optical quality at capture due to the elements of the imager system itself.

Thus, a need exists for an apparatus, system and method that may avoid discrete lens manufacturing for an imager system, and may eliminate the need for complicated automation to assemble the lens, such as in active alignment.

SUMMARY

In some illustrative embodiments, an apparatus, system and method are disclosed for a manufactured imager system. The imager system may include an imager comprising a plurality of photosites divisible into a plurality of subsections, and at least one wafer-level lens additively composed of a plurality of material layers successively deposited directly upon the imager to achieve a predetermined optical performance for each of the plurality of subsections. The material layers may comprise one or more of a photopolymer, a thermoplastic resin, a low temperature melting glass, and a glass sheet, and may be uniform or non-uniform.

A configuration for manufacturing an imager system may include fixing the imager system relative to a focal target; activating an imager in the imaging system; assessing a baseline optical signature of aspects of the activated imager based on a first optical response of the aspects to the focal target; based on the baseline optical signature, computing at least one a first parameter of material to be deposited on the imager; and first depositing the at least one first parameter of material.

An apparatus for manufacturing an imager system may include non-transitory computing code tangibly embodied on at least one computing memory associated with at least one computing processor, which code, when executed by the at least one processor, causes to be executed the steps of: activating an imager in the imaging system fixed relative to a focal target; assessing an optical signature of aspects of the activated imager based on an optical response of the aspects to the focal target; based on the optical signature, computing at least one first parameter of material to be deposited on the imager; and causing to be deposited the at least one first parameter of material.

Thus, the disclosed embodiments provide an apparatus, system and method the avoids discrete lens manufacturing for an imager system, that avoids the need for supply chain management and variations in processes and parts through a supply chain, that eliminates the need for complicated automation to assemble the lens, such as in active alignment, in an imager system, and that eliminates the need for complicated automation to assemble the lens in an imager system and to perform post-assembly testing and mechanical adjustment of the lens.

BRIEF DESCRIPTION OF THE FIGURES

The present disclosure will become more fully understood from the detailed description given herein below and the accompanying drawings, which are given by way of illustration only and which thus do not limit the present disclosure, in which like numerals represent like elements, and wherein.

DETAILED DESCRIPTION

Figure 1:
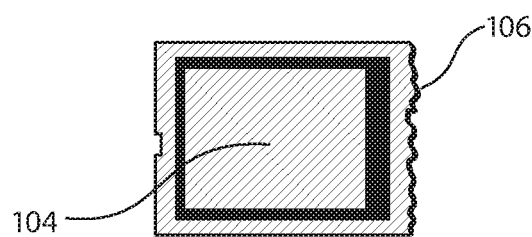
FIG. 1 is a prior art illustration of an imager chip having thereon a plurality of photosites.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Certain exemplary embodiments provide a low cost, additive manufacturing solution to allow for the direct manufacturing and simultaneous in situ positioning of a lens relative to an imager to provide an imager system. The manufacturing of the lens in the imager system may include a simultaneous altering of the position and/or composition of the optical device, e.g. the lens, associated with the imager system. Certain exemplary embodiments may employ a layered stacking of photopolymer or thermoplastic resin, or low temperature melting glass, in the optical path during manufacture of a lens in order to obtain the desired optical signatures in a completed imager system assembly. Certain exemplary embodiments may include injection molding of lenses on imaging die wafers, such as for imaging or projection applications.

Certain embodiments allow the disclosed manufacturing processes to compensate for a wide range of tolerance issues within the imager and in any additional cover glass, and additionally eliminate the need to compensate for the tolerance issues associated with the discrete manufacturing and alignment of optical lenses manufactured using traditional manufacturing process, such as injection molding or machining. Disclosed embodiments also address the high cost of manufacturing and the manufacturing complexity presented by typical imager manufacturing.

FIG. 1 is a prior art illustration of an imager chip 100 having thereon a plurality of photosites 104, and a pin output 106 such as may be provided for connection to a board bus (not shown). Imager 100 may be configured with a first surface and a second surface as shown. The first surface may be equipped with the plurality of photosensitive elements 104 arrayed in a photosensitive area for sensing light. The first surface may be provided with a plurality of contacts (not shown) that couple to the photosensitive area and that are electrically connected to the photosensitive elements through an internal circuit. Such contacts may take the form of conventional structures, like a plurality of conducting channels that may pass from the plurality of contacts through a first surface to a plurality of solder ball pads (or other suitable contact material) for electrically coupling the first surface to a second surface, such that the conducting channels may communicatively couple the photosensitive elements 104 and external electrical connections, such as pin output 106.

Figure 2A:
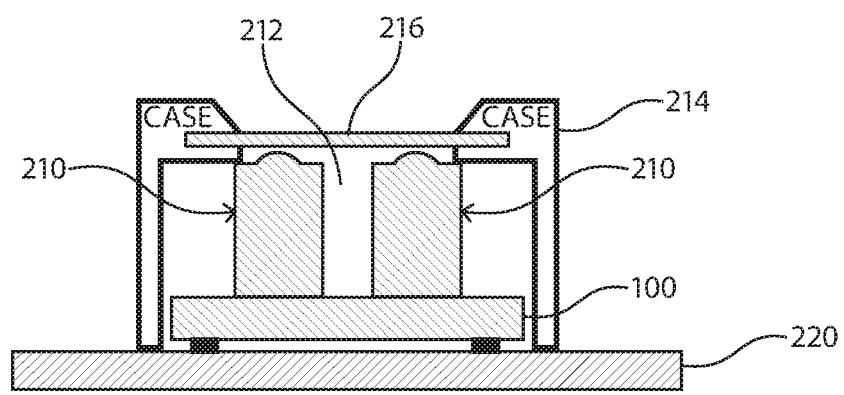
FIG. 2A is an exemplary illustration of two exemplary wafer-level lenses associated with an imager chip.
Figure 2B:
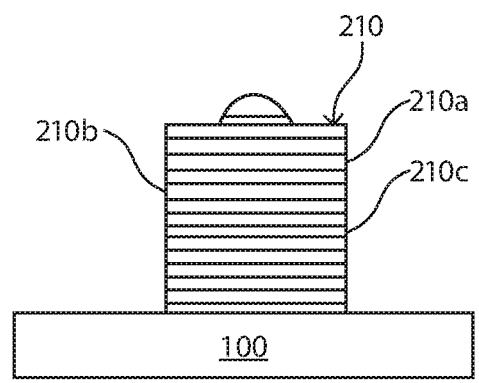
FIG. 2B illustrates an exemplary imager system having a single lens associated with an imager.

Imager 100 may include one or more wafer-scale lenses 210, as illustrated in FIGS. 2A and 2B. By way of non-limiting example, wafer level lens 210 may be configured as a polygon-type shape, such as a rectangular parallelepiped. A "lens" may include the optical device portion of the lens, i.e., to a substantially optically clear portion of the lens, and/or the optical device and a barrel in which the optical device may reside.

FIG. 2A is an exemplary illustration of multiple exemplary wafer-level lenses 210 associated with imager chip 100. In an illustrative embodiment, lenses 210 and imager 100 form imager system 212. In an embodiment, imager system 212 is encased within casing 214. In an embodiment, casing 214 may include filter 216, such as a glass filter, proximate to the lens 210 inlet. In the illustrated embodiment, image system 212 is communicatively coupled with printed circuit board (PCB) 220 for receiving operational and/or control signals.

FIG. 2B illustrates an embodiment of an imager system 212 having a single lens 210, such as a single optical device, associated with imager 100. In the illustrated exemplary embodiment, lens 210 is formed of multiple layers, such as at least two layers, formed of deposited material 210a, 210b, 210c. The deposited material in each layer may be one or more of a photopolymer or thermoplastic resin, or low temperature melting glass or glass sheet, by way of non-limiting example, and may be uniform or non-uniform (e.g., graduated). Further, the material may be cured upon or after deposition.

Exemplary embodiments of deposited materials 210a, 210b, 210c may include: a viscous photopolymer, such as a mixture of monomers, oligomers, and photo initiators conformed into a hardened polymeric material through curing; a low temperature melting glass, such as printed in liquid hot form; or thermoplastic resins, such as commercially available optically clear thermoplastic resins, which may be provided using commercially available 3D printers using hot or cold extruders, directly applied in additive steps to the imager in the optical path.

In certain embodiments, the lens material(s) that forms the layers of lens 210 thus becomes an integral part of the imager die 100 that it is deposited upon, thereby forming imager system 212 on a layer-by-layer basis. Such an integral lens may be additionally formed on die 100. Additive steps for such a layer-by-layer formation may include, by way of non-limiting example, depositing, fused deposition, dispensing, spraying, extruding or laminating extremely thin layers, sheets, gels, or nano-particles, of material(s), which layers may be uniform or non-uniform, or doped or undoped. For example, layers 210a, 210b, 210c may be created using a lamination process, such as with a UV curable adhesive between lamination layers.

In certain embodiments, the lens 210 may be disposed on the electronic imager one layer, such as one submicron layer, at a time without interfering interfaces, such as air, or interfering material disposed between the layers. In certain embodiments, multiple layers may be formed sequentially or substantially simultaneously. Such a disposition may occur in a manner that imparts the desired properties to the imager system 212. By way of example, the thickness or height of a photopolymer or thermoplastic resin, or low temperature melting glass or glass sheet, may be tall, wide and/or thick enough so that when the layers are manufactured or otherwise formed as discussed herein throughout, the lens 210 thus formed is accurately positioned and compositioned in relation to the electronic imager 100 and relative to the focal length of the lens 210. In certain embodiments the thickness or height may additionally be short, narrow or thin enough so that only incremental layers, such as of submicron thickness, may be added in order to adjust the focal length to optimal desired point. Likewise, the optical diffraction grating of the lens 210, or any other characteristics of the lens 210, may be adjusted by altering process parameters, such as material properties, rate of or amount of deposition, time or profile of curing, or the blending of different materials. In certain embodiments, such as where no dedicated bonding interface, such as an adhesive or an air gap, is required to bond or modify the lens 210, the lens 210 thus formed may require no mechanical, automated, active, or passive additional alignment of, for example, a lens barrel post- or during assembly, as is required in present camera manufacturing applications.

Figure 3:
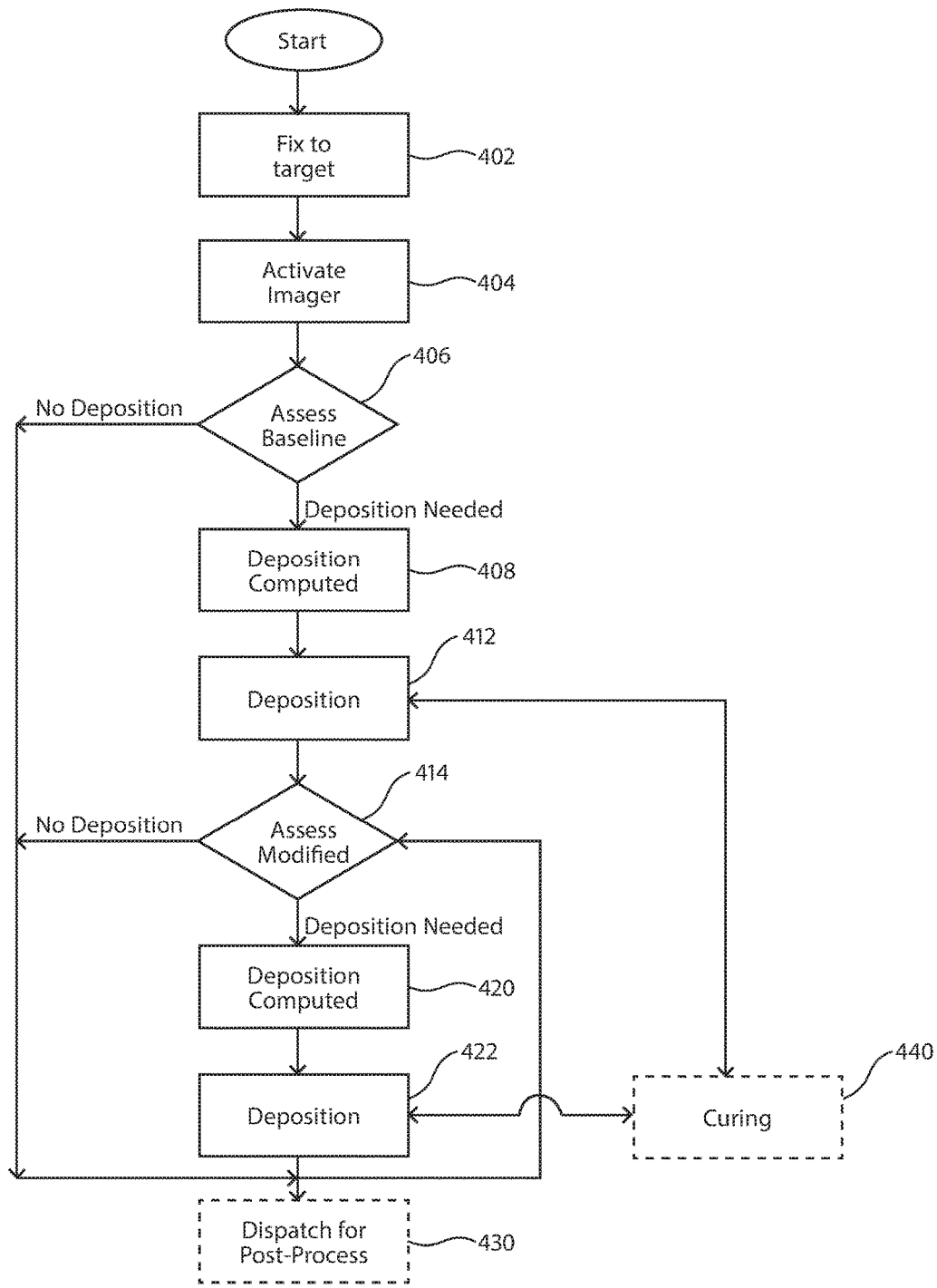
FIG. 3 illustrates an exemplary configuration of an imager system.

FIG. 3 illustrates an exemplary embodiment of a configuration 400 in accordance with the disclosure. The configuration developed in the illustration of FIG. 3 is exemplary in nature only, and thus those skilled in the art will appreciate that any layout, or different lensing system layouts, may be provided according to the disclosure. For example, although the optical performance assessments may be discussed in the exemplary embodiments with respect to a focal target, these assessments may be made based on response to any optical stimuli, and/or using a reference device (such as a golden lens), and/or using measurements of the position of the imager.

In the illustrated embodiment, at step 402 an imager system is placed in a fixture, such as including a focal target, which fixture may additionally be associated with a deposition chamber. At step 404, the imager of the imager system in the fixture is activated.

An imager may be powered up at step 404 such that a frame grabber stores images received at the imager, for example. The imager, which may or may not include an initial several of layers of the deposited lens in the optical path, may be, in situ, pointed toward a focal target of the fixture at step 402.

A baseline optical signature of various subsections of the imager may be determined using the activated imager while within the fixture, at step 406. From the baseline, an algorithm applied by a processor communicatively associated with the imager system in the fixture may compute process parameters of the lens material such as a minimum uniform or variable thickness and minimal composition of lens, such as optical material to be deposited/laminated/layered/applied ("depositer") on the imager at step 408. At step 412, the depositer may deposit the material.

The modified optical signature of the imager system, such as based on the optical or acceptable performance of the subsections after at least an initial deposition of material(s) at step 412, may be determined at step 414. The algorithm then computes next process parameters of the lens material such as a smallest incremental uniform or variable thickness and composition for newly deposited material(s), and thickness and/or composition variations as between the subsections, based on the determined optical signature, at step 420. At step 422, the depositer deposits the incremental material(s). In accordance with step 420.

In use, the baseline assessment of step 406 through step 414 may function under an illustrative embodiment by starting from a low end of a sharpness curve or center-of-focus score, or an image sharpness modulated transfer function (MTF), and deposit material such that between steps 406 to 414, the process determines that the sharpness curve is climbing or increasing. Once the sharpness curve rides over, the process continues to the next step before the sharpness curve or center of focus score or MTF is beyond the acceptable range. Characteristics that may be considered for controlling the process of steps 406-414 include, but are not limited to, (1) a desired lens design (physical shape, optical properties) based on target sharpness curve or center of focus score or MTF associated with the product utilizing a known family of imager dies; (2) a target combination of material types, properties, thickness and thickness variability in cured or uncured stage over the span of the imager that help achieve the desired lens design; and (3) deposition machine parameters that help achieve the target conditions of (2) that lead to a desired lens design. The correlation between (1)-(3) may be established based on prior experimentation. The process may compute a correlation and make the adjustments to material selection and/or machine parameters based on observed sharpness curve or center of focus score or MTF.

In certain embodiments, steps 414, 420 and 422 may be repeated until acceptable desired optical signature is determined (for all or certain subsections) according to step 420. For example, deposition of the lens material, such as using the herein disclosed additive techniques, may be manipulated using, for example, material and process combinations described herein until optimal desired optical performance is achieved in accordance with the applied algorithm. In embodiments, when the optimal optical performance is achieved, the imager system 212 should produce an optimally acceptable image with a desired image formation. Once an optimal signature, such as a predetermined optimal optical performance for each subsection, is obtained, the imager system may be dispatched for post processing at step 430.

More specifically, an optical performance characteristics of an image assembly may be divided into subsections, such as in the vertical and horizontal directions, and optical signatures associated with the subsections may be determined based on the images grabbed and stored, for example. That is, the baseline optical signature for an imager may be measured, and may be algorithmically monitored by a processor in comparison to optical desired performance for that imager, at step 406. As additional material is deposited to form the lens, the performance impact of the deposited materials on the optical performance may be verified for each subsection at steps 412 and 414, and subsequent layers and/or types of materials for each of those subsections may be algorithmically adjusted, as instructed by the processor, at steps 420 and 422 in order to provide the desired optical signature for association with each specific subsection. Those skilled in the art will appreciate, in light of the instant disclosure, that the processor-applied algorithm may compute variations of parameters necessary between the different subsections of the imager die in order to meet the optical performance.

By way of non-limiting example, variations in spacing between the lens and the electronic imager may be accommodated by the viscous photopolymer during the layering process, or may be deemed inconsequential or not needed, in order to achieve the desired optical performance using the disclosed algorithm as applied by the processor. Further, a photopolymer or thermoplastic resin, or a low temperature melting glass, may be adjusted as to construction or composition, or may be moved as to a relative position, or may be attached/added or unattached, in relation to the imager in order to better achieve the target optical performance. In short, layers, such as the submicron layers of a photopolymer or thermoplastic resin, or low temperature melting glass, that form the lens, or the compositions, characteristics, or extent of such layers, may be changed or varied one to another to achieve an optimal or desired optical performance.

In certain embodiments, the layers of a photopolymer or thermoplastic resin, or low temperature melting glass (all by way of non-limiting example only), may be cured 440, such as being continuously cured at, or cured after, deposition, such as using a thermal or ultra-violet light source, ambient environment, or exothermic reactions. After curing of respective layers an optical distribution resulting in an acceptable image, thus indicating an acceptable lens and imager die alignment, may be achieved and the layering and/or curing processes may be ceased, simultaneously completing the manufacturing of the imager system and the fixing of the lens into the optimal focal position.

In some illustrative embodiments, curing may be optional between steps 412 and 414. In one example, some materials may be determined to have a MTF/center of focus scores/sharpness curves that remains unchanged between an uncured and cured stage, indicating that curing may not be required. Other materials may be determined to have a MTF/center of focus scores/sharpness curves that changes (e.g., increases), indicating that curing is required before proceeding to a next step. Accordingly, under one illustrative embodiment, a curing step may be performed after step 412 with a bypass to step 414 if curing is not required for some materials/deposit conditions.

Figure 4:
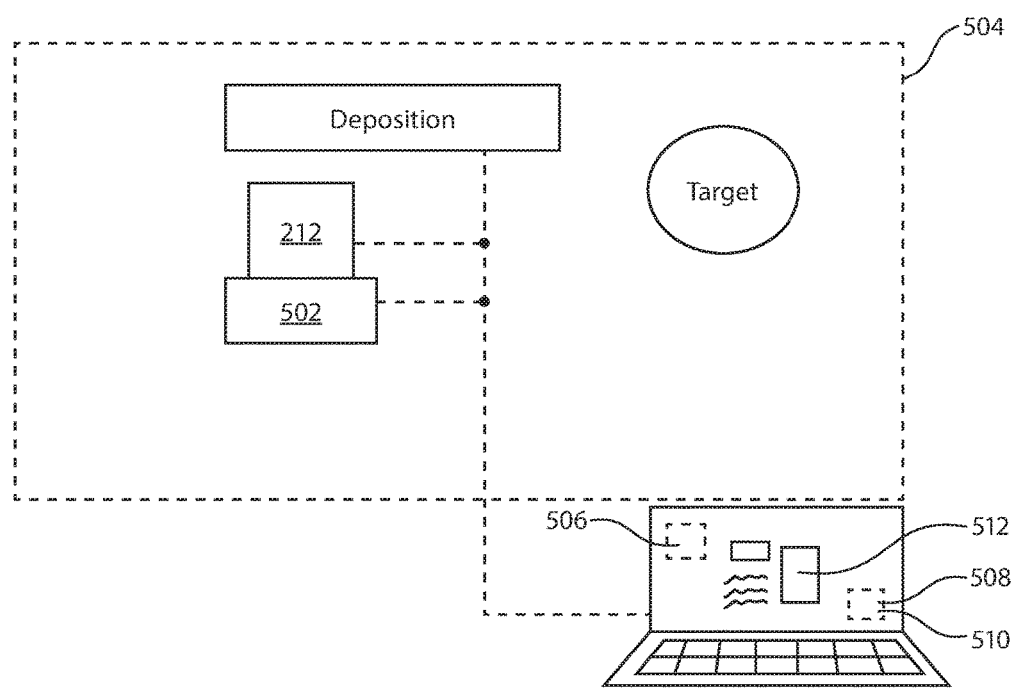
FIG. 4 is an exemplary illustration of a configuration for the manufacture of an imager system.

FIG. 4 is an exemplary illustration 500 of a physical setup suitable for use with the configuration of FIG. 3. The imager system 212 under test may be placed in fixture 502, such as within a deposition chamber 504. As referenced, the adjustment and monitoring of the disclosed configuration, such as depositions, of imager system 212 may be managed using a processor 506 applying, from a tangible computing memory 508, an algorithm implementing code 510. The algorithm may access, by way of example, a look up table (LUT) that may include a correspondence between imaging characteristics and deposition aspects. The implementation of the algorithm may be monitored or modified using a graphical user interface (GUI) 512 that may also be provided by code 510, or using a manual adjustment process which may likewise be managed using the GUI 512.

The processor referenced in the foregoing illustrative logical modules, algorithms, GUI(s), and virtual circuits and described in connection with the disclosure herein may be implemented or performed with a general-purpose processor, a digital signal processor (DSP), an application specific integrated circuit (ASIC), a field programmable gate array (FPGA), or any other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The processing steps and/or "code" described in connection with the disclosure herein may be embodied directly in hardware, in a software module executed by a processor, or in a combination of the two. A software module, i.e., code, may reside in the referenced tangible computing memory, such as RAM memory, flash memory, ROM memory, EPROM memory, EEPROM memory, registers, hard disk, a removable disk, a CD-ROM, or any other form of storage medium known in the art. A storage medium, such as the computing memory, is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In exemplary embodiments, the code may be stored on, or transmitted over as one or more instructions or code on, a computer-readable medium, and preferably on a non-transitory computer-readable medium. Computer-readable media includes both computer storage media and communication media including any medium that facilitates transfer of a computer program from one place to another, such as over a local or wide area network, a cellular network, a satellite network, or the like. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any aforementioned media connection is properly termed a computer-readable medium. For example, if the code is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Figure 5:
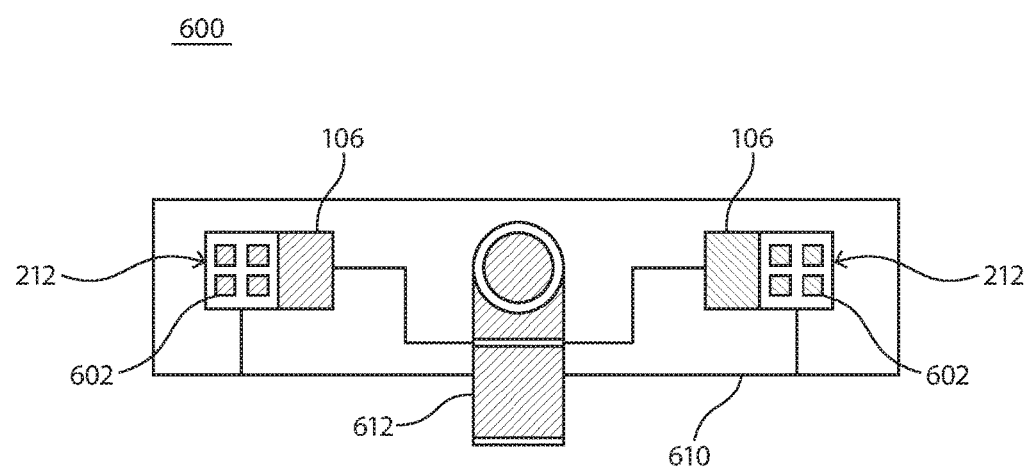
FIG. 5 is an arrayed lens wafer level camera module shown in an illustrative embodiment.

Referring now to FIG. 5, an arrayed lens wafer level camera module 600 is shown in an illustrative embodiment. These are illustrated as 2×2 arrays of lenses 602 configured within respective imager systems 212 on a camera circuit board 610. A lens array of any number, including a single lens, may be implemented according to certain embodiments disclosed herein, and the lens array may be symmetric or asymmetric. Lens array 602 is a multi-layer lens that may be formed, focused, aligned and otherwise optimized using the herein-disclosed exemplary methodologies and configurations, such as that discussed with respect to FIG. 3.

In the illustrative embodiment, each of the imager systems 212 has its own dedicated imager output 106. Further, camera module 600 additionally has its own output 612 to access the main processor of a device associated with camera module 600.

Certain exemplary embodiments of the present disclosure mitigate or eliminate the need for a lens barrel and/or a fixed standoff, and/or for the use of adhesives and/or automation or manufacturing involving discrete parts manufactured in different processes, in order to achieve desired focal length, for example. Thus, such exemplary embodiments may reduce overall product cost and time to assembly, improve precision, and/or eliminate the need to maintain an inventory of and/or binning of lenses.

As compared to lens barrel and mechanical adjustment or active alignment using adhesives, potential advantages of the exemplary embodiments include: reduced process steps and bill of materials (BOM); integrated lens manufacturing and alignment assembly processes; higher yields; lower cost and form factor than commercially available passive or active alignment process; improved optical performance due to elimination of interfering interfaces, such as air gaps; better transmissive performance for individual subsections of an imager die; elimination of the need to balance several different degrees of freedom for a lens in order to meet the optical signatures required in each subsection of an imager die; and elimination of the need for complicated and customer fixtures associated with each unique design of imager dies and camera module design. The disclosed embodiments may be used in camera modules, projection engines, optical fibers, feed tubes, light guides, imaging devices, projecting devices, and any product that requires the assembly of a lens or a lens-like part in order to provide an optical performance on the target.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those of ordinary in the pertinent art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein. That is, the claims which follow are to be accorded their respective broadest scope in light of the exemplary disclosure made herein.

What is claimed is:

1. A method of manufacturing an in-process modifiable imager system, comprising:
    fixing the imager system relative to a focal target;
    activating an imager in the imager system;
    assessing a baseline optical signature at least partially dictated by a prior process step parameter of the activated imager, based on a first optical response of the aspects to the focal target;
    responsive to the baseline optical signature, computing via at least one computing processor applying nontransitory computing code of at least one first parameter for material, the first parameter being selected from the group consisting of height, thickness and composition, to be deposited onto or between one or more layers of which the prior process step parameter on the imager is indicative, wherein the at least one first parameter is modified from the prior process step parameter; and
    executing a first depositing via a materials deposition process of the at least one first parameter of material on the imager based upon the computing via the at least one computing processor.

2. The method of claim 1, wherein the at least one first parameter comprises at least one of the amount and composition of the material to be deposited on the imager.

3. The method of claim 1, further comprising:
    assessing a modified optical signature of the aspects of the activated imager based on a second optical response of the aspects to the focal target;
    based on the modified optical signature, computing at least one second parameter of material to be deposited on the deposited at least one first parameter of material;
    second depositing via a materials deposition process of the at least one second parameter of material; and
    repeating the assessing the modified optical signature, the computing the at least one second parameter of material, until a predetermined optical signature of the aspects is present upon the assessing the modified optical signature.

4. The method of claim 1, further comprising storing images received at the activated imager.

5. The method of claim 1, wherein the first and second depositing comprise at least one of a deposition, a layering, a lamination, an application and a spraying.

6. The method of claim 1, wherein each of the baseline, modified and predetermined optical signatures comprises an optical performance.

7. The method of claim 1, further comprising:
    dispatching the imager system from the fixing for post processing once the predetermined optical signature of the aspects is present; and
    post processing the imager system.

* * * * *